US006826489B2

(12) United States Patent
Scanlan et al.

(10) Patent No.: US 6,826,489 B2
(45) Date of Patent: Nov. 30, 2004

(54) FAULT CLASSIFICATION IN A PLASMA PROCESS CHAMBER

(75) Inventors: John Scanlan, Waterford (IE); Michael B. Hopkins, Dublin (IE)

(73) Assignee: Scientific Systems Research Limited, Dublin (IE)

( * ) Notice: Subject to any disclaimer, the term of this patent is extended or adjusted under 35 U.S.C. 154(b) by 244 days.

(21) Appl. No.: 10/076,803

(22) Filed: Feb. 14, 2002

(65) Prior Publication Data

US 2003/0153989 A1 Aug. 14, 2003

(51) Int. Cl.$^7$ .............................. G01B 7/00; G01N 27/66
(52) U.S. Cl. ........................... 702/38; 324/459; 702/85
(58) Field of Search .............................. 702/31, 35, 38, 702/60, 84, 85, 100, 182, 183, 189; 700/79, 108, 110, 123; 438/694; 356/72; 324/459, 709; 315/111.21, 111.51

(56) References Cited

U.S. PATENT DOCUMENTS

| | | | |
|---|---|---|---|
| 5,576,629 A | * | 11/1996 | Turner et al. ................ 324/709 |
| 5,642,296 A | * | 6/1997 | Saxena .......................... 702/84 |
| 5,691,642 A | | 11/1997 | Dobkin ......................... 324/464 |
| 5,808,415 A | * | 9/1998 | Hopkins ................. 315/111.21 |
| 6,252,354 B1 | * | 6/2001 | Collins et al. ........... 315/111.51 |
| 6,441,620 B1 | * | 8/2002 | Scanlan et al. ............. 324/459 |
| 6,603,538 B1 | * | 8/2003 | Oluseyi et al. ................ 356/72 |
| 6,656,843 B2 | * | 12/2003 | Bol ............................. 438/694 |

FOREIGN PATENT DOCUMENTS

IE        82556        10/2002

* cited by examiner

Primary Examiner—John Barlow
Assistant Examiner—John Le
(74) Attorney, Agent, or Firm—Thomas M. Freiburger

(57) ABSTRACT

A method of fault classification in a plasma process chamber powered by an RF source includes initially running a plurality of different baseline plasma processes on the chamber. For each baseline process, the magnitudes of a plurality of Fourier components of delivered RF power are determined and stored as an impedance fingerprint for that baseline process. In the case of a fault, one or more of the baseline processes is repeated according to a predetermined decision tree to determine the current fingerprints and classify the fault by comparing the current fingerprints with the original fingerprints.

7 Claims, 5 Drawing Sheets

FAULT CLASSIFICATION IN A PLASMA PROCESS CHAMBER

BACKGROUND OF THE INVENTION

1. Field of the Invention

The present invention relates to a method of fault classification in a plasma process chamber powered by an RF source.

2. Prior Art

Many thin film processes use plasma processes to facilitate the rapid and accurate fabrication of minute structures with desired properties. Plasma processes include the deposition and etching of insulators, conductors and semiconductors on a substrate, for example, a silicon wafer. The plasma process usually involves placing the substrate in a vacuum chamber, introducing process gases and applying radio-frequency (RF) power, typically 0.1 to 200 MHz, to create a plasma. The plasma consists of ions, electrons, radical gas species and neutral gas, all of which permit the desired reaction to proceed. The plasma reaction has many inputs, including RF power, gas type and flow rates, chamber pressure, substrate and wall temperatures, chamber wall conditions, electrode spacing, and so on.

Control of the complex plasma process is the key to improved manufacturing, i.e. to have accurate and repeatable processing the plasma itself should be repeatable.

Unfortunately there are few schemes in existence for direct plasma monitoring and control. It is more usual to monitor or control process inputs such as gas flow, power output from RF generator, chamber pressure or temperature, etc., using statistical process control charts. However, since the plasma process depends directly on the plasma parameters, measuring these indirect variables is generally not sufficient.

In the ideal production scenario, the plasma chamber operates continually, only stopping for scheduled maintenance. However, because of the complexity of the process, faults do occur, resulting in unscheduled tool downtime. To maximize productivity, these faults need to be repaired as rapidly as possible. Faults generally appear either as aborts on process set points or as out of control product metrology, which includes fails in parameters such as etch rate on test wafers as well as device yield drops.

Because of the dearth in tool control and monitoring, faults are often addressed using a cause and effect approach. For example, during production monitor checks it may be that there is an out-of-control etch-rate. The technician will consider all inputs (causes) which affect etch rate, including plasma power, pressure, gas flows, cathode position and others. Generally there will be few clues as to which has changed so all may have to be checked. This is costly in terms of labour and lost production time. Furthermore, the drive to return the process tool to production as rapidly as possible may involve unnecessary parts replacement, again incurring significant cost.

The RF powered plasma represents a non-linear complex load in electrical terms. This results in the generation of harmonics of the RF driving signal. These harmonics, known as Fourier components, are very sensitive to changes both in the plasma process and the process parameters.

It is generally accepted that monitoring the Fourier components of the RF power signal provides a useful way to monitor the plasma process. These components are a more direct measurement of the plasma process since they are more directly related to fundamental plasma parameters.

It is known to use an RF sensor to monitor and control RF plasmas by measuring the Fourier components of voltage and current. The sensor can be used in closed or open loop control, as for example, in etch end-point control or as in-situ monitoring of the plasma process. In either case the plasma can be terminated when one or more of the RF Fourier components reaches pre-determined limits.

Unfortunately, when problems occur in the plasma reactor due to undesired changes in input parameters, such as changes in gas flow rate, the RF sensor as previously described can only determine that a fault has occurred, i.e., it cannot determine the exact fault mechanism or faulty component.

There is a need, therefore, for an improved method for fault identification on plasma processing chambers.

SUMMARY OF THE INVENTION

Accordingly, the present invention provides a method of fault classification in a plasma process chamber powered by an RF source, comprising the steps of:

a) running a plurality of different baseline processes on the chamber, (b) in respect of each baseline process, determining the magnitudes of a plurality of Fourier components of delivered RF power and storing the magnitudes as reference data for that baseline process, and c) when a fault is to be classified, repeating at least one of the said baseline processes according to a predetermined decision tree to classify the fault by comparing the current magnitudes of the said Fourier components with the corresponding reference data.

In the present specification a baseline process is a plasma process with pre-determined values for the process input parameters. It is therefore a datum from which inferences regarding the plasma process may be drawn.

An embodiment of the invention involves the maintenance of a set of baseline impedance fingerprints for a given plasma chamber. This set includes an impedance fingerprint of the chamber running a typical process recipe. Also included is an impedance fingerprint of the chamber alone, without any plasma. Also included is a fingerprint of the plasma chamber running an inert gas plasma. All of these impedance fingerprints includes a set of electrical signals associated with the RF power delivery. They may include RF fundamental and Fourier components of voltage, current and phase and derived impedance.

This set of impedance fingerprints is recorded and maintained regularly. When a fault occurs on the chamber, a systematic approach to fault finding is employed. Each individual impedance fingerprint is retaken as necessary and compared to each of the baseline impedance fingerprints. The approach allows the user to classify the fault as either a hardware component, or a process component.

The invention therefore provides a technique that allows an operator to diagnose the cause of a fault, or at least eliminate a large number of probable causes, which would otherwise prove costly to investigate.

BRIEF DESCRIPTION OF THE DRAWINGS

An embodiment of the invention will now be described, by way of example, with reference to the accompanying drawings, in which.

DETAILED DESCRIPTION OF A PREFERRED EMBODIMENT

Figure 1:
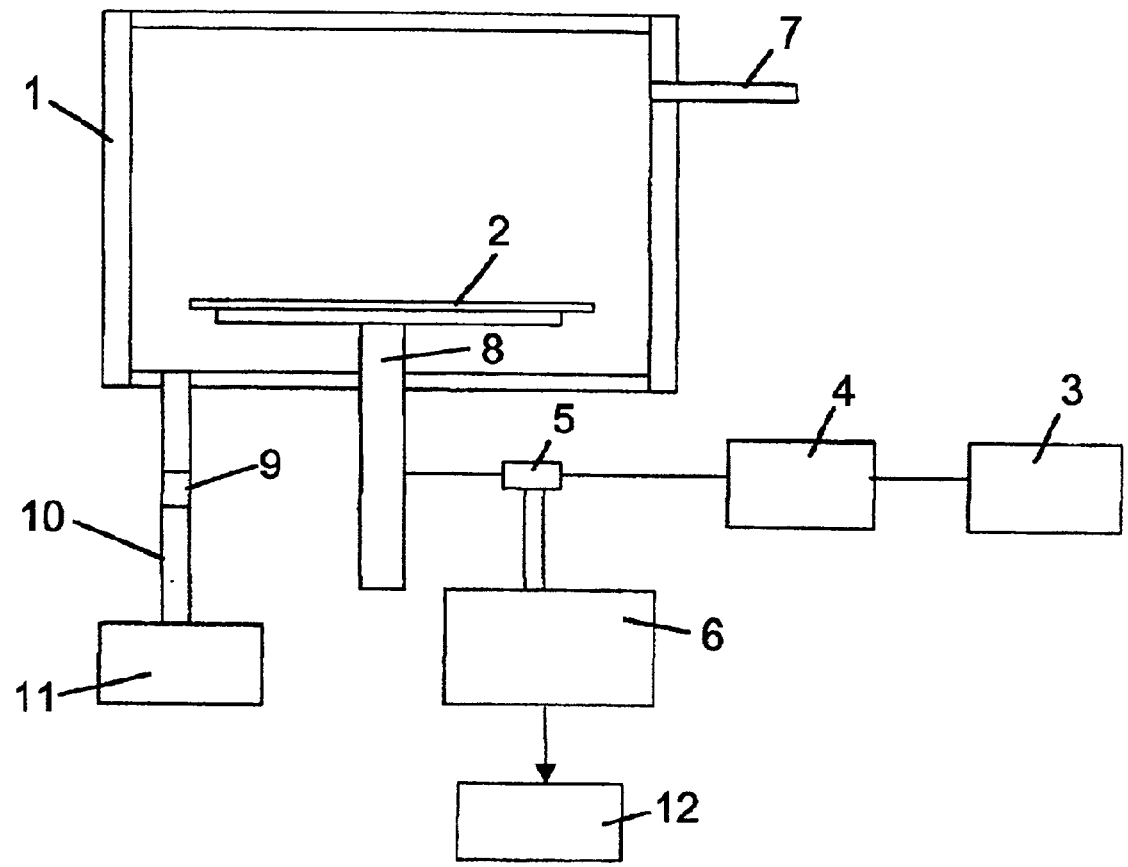
FIG. 1 depicts a typical plasma process chamber.

FIG. 1 shows a typical plasma process reactor. It includes a plasma chamber 1 containing a wafer or substrate 2 to be processed. A plasma is established and maintained within the chamber by an RF power source 3. This source generally has real output impedance which must undergo a transformation to match that of the complex plasma load. This is done via match network 4. Power is coupled to the plasma chamber, typically by capacitive coupling, through an electrode 8. However, the invention also applies to systems that have more than one capacitive electrode, those that are inductively coupled or transformer coupled, helical/helicon wave systems and electron-cyclotron resonance systems. Process gases are admitted through gas inlet 7 and the chamber is maintained at a desired process pressure by removing process gases and by-products through gas exhaust line 10 using pump 11. The plasma permits effective manufacture of for example, semiconductor devices. Gases such as $Cl_2$, used to etch silicon and metal, for example, are converted into reactive and ionized species. Etching of the very fine geometry used to fabricate semiconductor devices is made possible by the reactive gases, ions and electrons of the plasma.

The wafer is processed according to some recipe, which is controlled by the chamber operator. This recipe includes input parameter settings such as process gas types and flow rates, chamber pressure, substrate/wall temperatures, RF power settings on one or more power generators, recipe time, inter-electrode spacing, etc. This is the case for all plasma processing tools, such as etch, deposition, etc. The wafer will undergo very many plasma process steps before completion. Each step contributes to the overall product yield; a fault at any one step may destroy potential product.

Referring again to FIG. 1, an RF sensor 5 is used to measure the voltage and current of the RF electrical power signal in the complex post-match electrical line. A Fourier Transform is performed in data collection electronics 6 using a sampling technique which extracts the Fourier components of the voltage and current and the phase angle between these vectors. This data sampling should have sufficiently high resolution to determine Fourier components (in this embodiment the first five including the fundamental) across a very large dynamic range (90 dB) with phase resolution of up to 0.001 degree. Suitable techniques for high resolution sampling and measurement of Fourier components are described in U.S. Pat. No. 5,808,415. The output of the data collection electronics 6 is connected to a controller 12 which may be a computer or other system which uses the signals to yield information about and/or control the plasma process.

Figure 2:
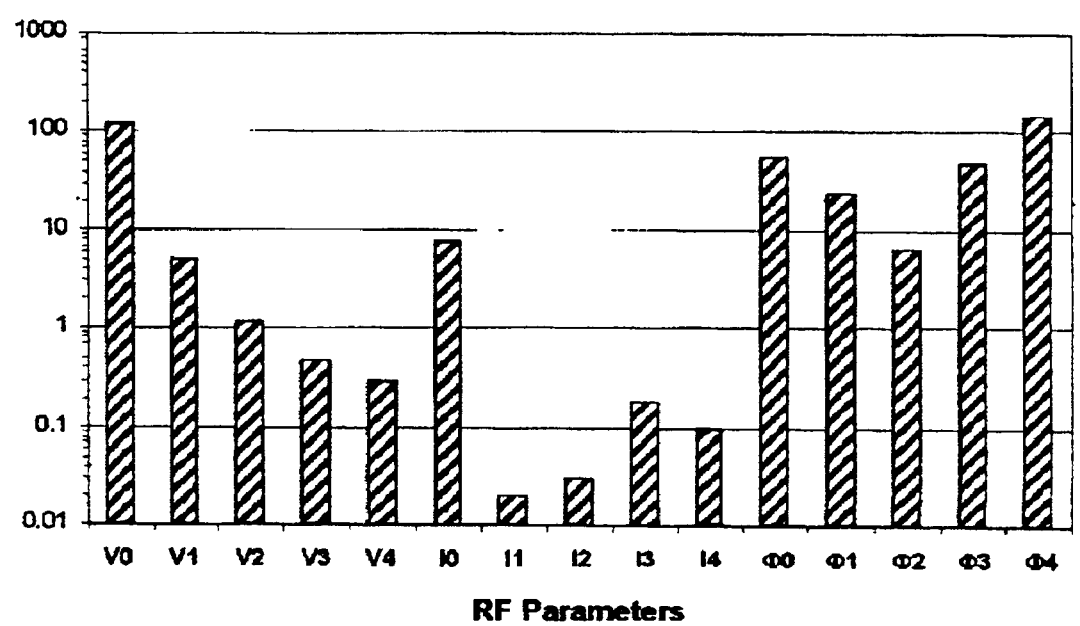
FIG. 2 shows a baseline impedance fingerprint.

The Fourier components are very sensitive to plasma events. FIG. 2 shows the magnitudes of voltage, current and phase of the delivered RF power at the fundamental and four higher harmonics for a typical plasma process. Such a set of data is referred to herein as an "impedance fingerprint". In the present embodiment, three different baseline plasma processes are run on the chamber 1 using a test wafer in each case and, in respect of each such process, the corresponding impedance fingerprint is determined and stored as reference data for that process by the electronics 6 and controller 12.

Firstly, a baseline process is run using a typical process recipe. In particular, the same gases are included as those used in the production run for which the chamber is currently being used or intended to be used. The exact flow rates are not important, only that the baseline process always uses the same flow rates each time it is run. This is referred to as the full process baseline. In the case of an oxide etch process, for example, this may involve running plasma power (which may include a plurality of power sources), maintaining the chamber at a selected process pressure, and running gases such as O2, CHF3, CF4 etc. All process inputs are fixed for this baseline. Secondly, a baseline process is run using an inert gas plasma only, such as helium. This is referred to as the inert plasma baseline. Finally, a baseline process is run in which very low power is delivered to an evacuated chamber so that no plasma ignites. This is referred to as the plasma-less chamber baseline. In each case the respective baseline impedance fingerprint is determined and stored as reference data. The test wafer may be a polysilicon wafer in each case, but the baseline processes may be carried out with other substrates or indeed no substrate.

Figure 3:
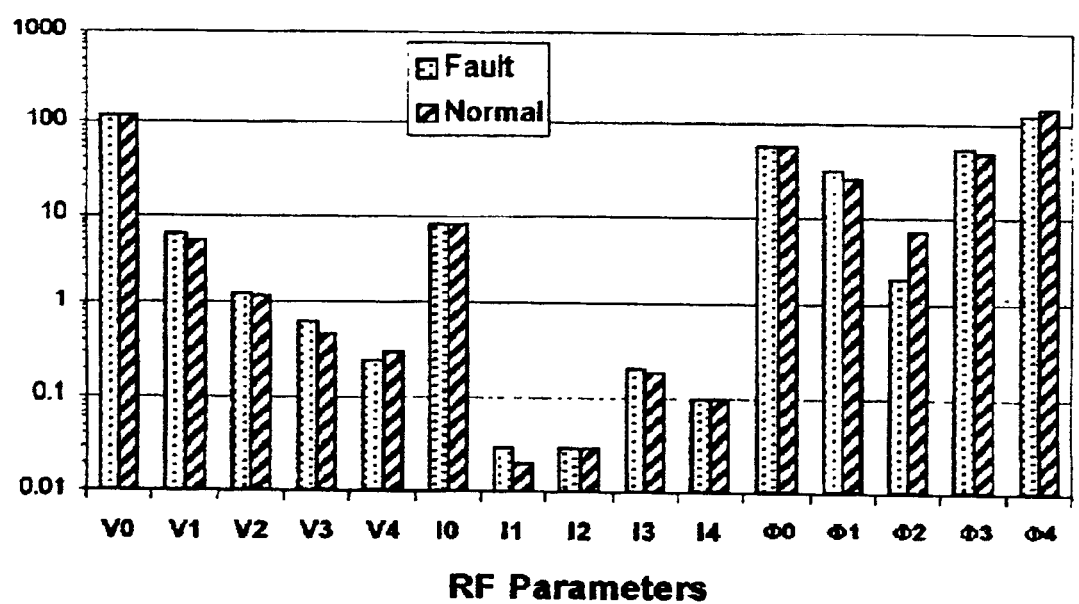
FIG. 3 shows a baseline impedance fingerprint against a fault impedance fingerprint.

A wafer fabrication process typically involves running entire batches of wafers with similar plasma process recipes to ensure reliable volume production. If the plasma process on each wafer is the same, then the measured Fourier components will reflect this. Any change in the plasma process will be registered by change(s) in the Fourier components. FIG. 3 shows a typical impedance fingerprint taken following a fault condition compared to the baseline impedance fingerprint taken under normal conditions. A change is apparent.

The use of the baseline impedance fingerprints for fault classification will be described with reference to the decision tree shown in FIG. 4. The starting point is the running of the three different baseline processes on the plasma chamber 1 and the storage of their respective impedance fingerprints, step 20, as described above. During a subsequent production run the plasma process is monitored for faults, steps 22 and 24. If a fault is detected, then the full process baseline is repeated and the corresponding impedance fingerprint determined, step 26. The new fingerprint is compared with the original full process fingerprint taken at step 20 by comparing the current magnitudes of the Fourier components with their original values, step 28. If no significant change is detected, the plasma has not changed, and the test wafers or metrology tool are determined to be at fault, step 30, and the production process is resumed, step 32. In this connection, a change is significant if it is outside the normal variance of the baseline repeated several times in a healthy chamber condition. If any one component is outside its normal variance (typically using 3-sigma, which represents a 98% confidence limit) the baseline is considered to have changed.

If a significant change is detected at step 28, the plasma-less chamber baseline is repeated and the corresponding impedance fingerprint determined, step 34, and compared to the original plasma-less chamber baseline fingerprint, step 36. If a significant change is registered, then the chamber hardware is inferred to have changed, step 38. By reference to the electrical design of the chamber, step 42, the fault can be traced and fixed, step 32. Note that other inputs such as process power, gas flows, pressure, etc., are not suspects so need not be tested, saving considerable time.

If no significant change is registered at step 36, the hardware is inferred to be good, and rather the plasma impedance is inferred to have changed, step 44. The load power is calculated as IVCos Φ, step 46, and compared to its original baseline value, step 48. If a significant change is recorded, the match unit or RF power generator are inferred to have changed, step 50. If the power is unchanged at step 48, the inert plasma baseline is repeated and the corresponding impedance fingerprint determined, step 52, and compared to the original inert plasma baseline fingerprint, step 54. If a significant change is recorded, it is inferred that the plasma has changed, step 56, and chamber pressure, vacuum integrity, inert gas flow are checked, step 58. If no significant change in inert impedance fingerprint is recorded then it is inferred one of the reactive gas components has changed, step 60, and they are individually checked, step 62.

Recording each of the impedance fingerprints is very rapid, so that the user can very quickly determine what class of fault has occurred, thereby eliminating a host of possible fault conditions which would otherwise need to be checked.

The method can also be used as a health check for RF plasma chambers following any scheduled downtime, for example preventative maintenance (PM) cycles. In many cases, the qualification of the chamber prior to hand-over to production is delayed by problems introduced during the PM. Thus, the three initial baseline processes would be performed before the scheduled downtime, and then the method of FIG. 4 performed after the downtime to detect and classify any faults.

Figure 4:
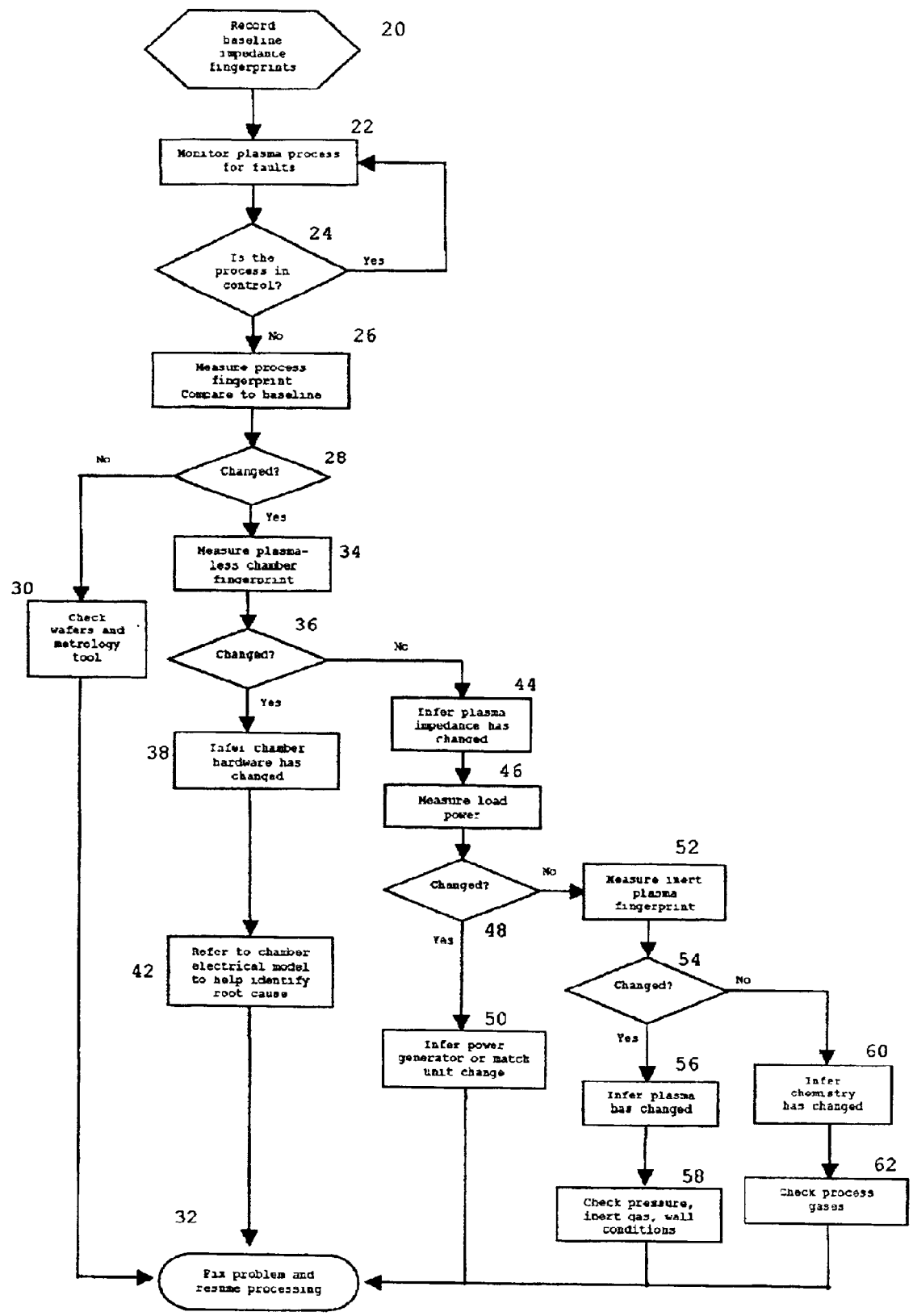
FIG. 4 is a flow diagram of the method in accordance with the present embodiment.

The method of FIG. 4 can also be used to compare two different chambers to solve inter-chamber differences. This can be a very costly issue in the production environment.

Ideally, all plasma tools running the same process should yield identically. However, small differences from tool to tool can mean different yield from each tool. In worst cases, processes have to be customised for individual chambers. Again, because of the dearth in control monitors, these differences cannot readily be solved.

Figure 5:
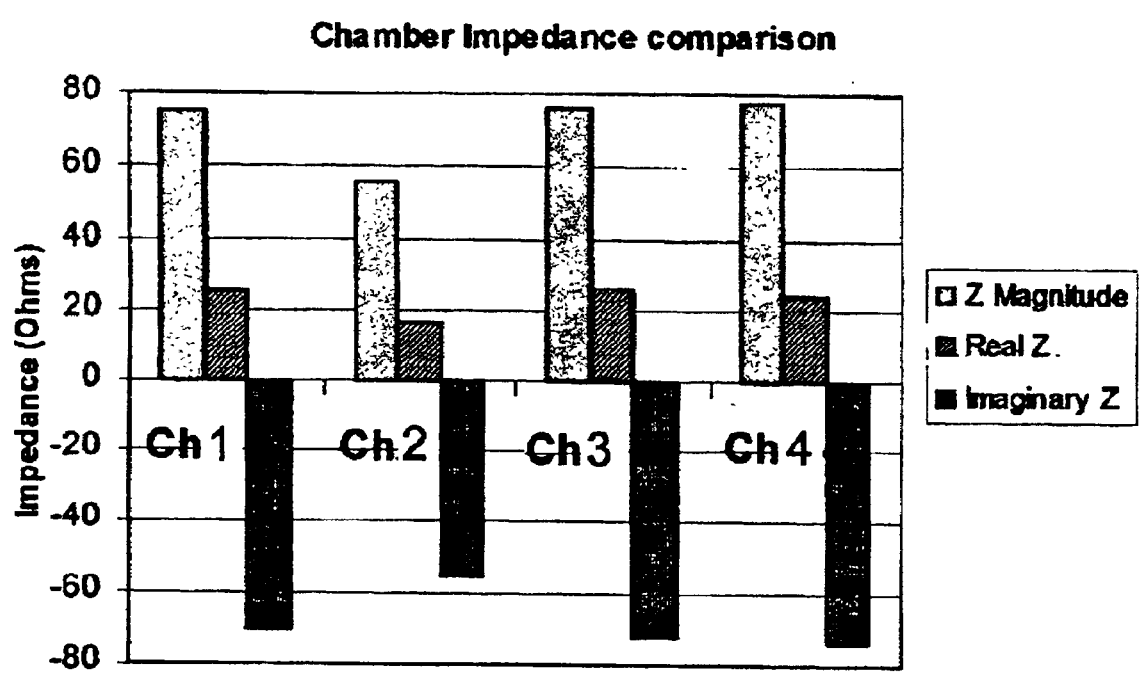
FIG. 5 shows how the method of FIG. 4 is applied to chamber difference resolution.

By using the method described herein, the user can determine in what class the differences lie. For example, hardware differences will show up when comparing the plasma-less impedance of chambers. FIG. 5 shows a comparison of four plasma chambers, where real impedance V/I Cos Ø, imaginary impedance V/I Sin Ø and phase, Ø, are displayed for each chamber. In this case chamber #2 has a different yield and the problem is apparent as a different plasma impedance. In this case, this difference was traced to hardware rather than process inputs, and a fix was rapidly found.

To use the method of FIG. 4 for comparing two different chambers, step 20 is carried out on one of two chambers to be compared and steps 26 onwards are performed on the second of the two chambers to be compared. Steps 22 and 24 are not applicable.

It is to be understood that the impedance fingerprints are not limited to the measurement of 15 Fourier components as described. Any number can be used, provided that there is a sufficient number of independent components to adequately classify the plurality of process inputs.

It should also be understood that a test wafer may not be necessary. The baseline processes may be run on an alternative substrate or with no substrate. Furthermore, it is also possible to run the baseline processes on a product wafer.

It should also be understood that the entire process may or may not be automated in software. The technique as described is performed in step-wise fashion. However, it is possible to automate the entire routine, from collecting the initial baseline data to reporting faults.

Although the embodiment described in FIG. 1 is that of a capacitively coupled or Reactive Ion Etch (RIE) configuration, the invention can be used in any RF plasma configuration. Also, although described for a semiconductor process, the invention can be applied to any plasma process, including the fabrication of flat panel displays, optical components, memory devices and any other process utilising plasma.

The invention is not limited to the embodiment described herein which may be modified or varied without departing from the scope of the invention.

What is claimed is:

1. A method of fault classification in a plasma process chamber powered by an RF source, comprising the steps of:
   (a) running a plurality of baseline processes of different types on the chamber,
   (b) in respect of each said baseline process, determining the magnitudes of a plurality of Fourier components of delivered RF power and storing the magnitudes as reference data for that baseline process, and
   (c) when a fault is to be classified, repeating more than one of the said baseline process types according to a predetermined decision tree to classify the fault by comparing the current magnitudes of the said Fourier components with the corresponding reference data.

2. A method of fault classification in a plasma process chamber powered by an RF source, comprising the steps of:
   (a) running a plurality of baseline processes of different types on the chamber,
   (b) in respect of each said baseline process, determining the magnitudes of a plurality of Fourier components of delivered RF power and storing the magnitudes as reference data for that baseline process,
   (c) when a fault is to be classified, repeating at least one of the said baseline process types according to a predetermined decision tree to classify the fault by comparing the current magnitudes of the said Fourier components with the corresponding reference data, and
   wherein steps (a) and (b) are performed prior to scheduled downtime of the chamber and step (c) is performed after the scheduled downtime and prior to a production run.

3. A method of fault classification in a plasma process chamber powered by an RF source, comprising the steps of:
   (a) running a plurality of baseline processes of different types on the chamber, wherein the baseline processes of different types comprise a first baseline process including the same gases as those used in a production run for which the chamber is used, a second baseline process running an inert gas plasma, and a third baseline process running at sufficiently low power that no plasma ignites,
   (b) in respect of each said baseline process, determining the magnitudes of a plurality of Fourier components of delivered RF power and storing the magnitudes as reference data for that baseline process, and
   (c) when a fault is to be classified, repeating at least one of the said baseline process types according to a predetermined decision tree to classify the fault by comparing the current magnitudes of the said Fourier components with the corresponding reference data.

4. A method of comparing two plasma process chambers powered by an RF source, comprising the steps of:
   (a) running a plurality of baseline processes of different types on one of the chambers,
   (b) in respect of each said baseline process, determining the magnitudes of a plurality of Fourier components of delivered RF power and storing the magnitudes as reference data for that baseline process, (c) running at least one of the said baseline process types on the other chamber according to a predetermined decision tree to classify any differences between the chambers by comparing the current magnitudes of the said Fourier components with the corresponding reference data, and wherein steps (a) and (b) are performed prior to scheduled downtime of the chamber and step (c) is performed after the scheduled downtime and prior to a production run.

5. A method of comparing two plasma process chambers powered by an RF source, comprising the steps of:

(a) running a plurality of baseline processes of different types on one of the chambers, wherein the baseline processes of different types comprise a first baseline process including the same gases as those used in a production run for which the chamber is used, a second baseline process running an inert gas plasma, and a third baseline process running at sufficiently low power that no plasma ignites, (b) in respect of each said baseline process, determining the magnitudes of a plurality of Fourier components of delivered RF power and storing the magnitudes as reference data for that baseline process, and (c) running at least one of the said baseline process types on the other chamber according to a predetermined decision tree to classify any differences between the chambers by comparing the current magnitudes of the said Fourier components with the corresponding reference data.

6. A computer-readable storage medium bearing program code adapted in execution on a computer to perform the following steps on a plasma process chamber powered by an RF source:

(a) run a plurality of baseline processes of different types on the chamber, (b) in respect of each said baseline process, determine the magnitudes of a plurality of Fourier components of delivered RF power and store the magnitudes as reference data for that baseline process, (c) when a fault on the chamber is to be classified, repeat at least one of the said baseline process types according to a predetermined decision tree to classify the fault by comparing the current magnitudes of the said Fourier components with the corresponding reference data, and wherein steps (a) and (b) are performed prior to scheduled downtime of the chamber and step (c) is performed after the scheduled downtime and prior to a production run.

7. A computer-readable storage medium bearing program code adapted in execution on a computer to perform the following steps on a plasma process chamber powered by an RE source:

(a) run a plurality of baseline processes of different types on the chamber, wherein the baseline processes of different types comprise a first baseline process including the same gases as those used in a production run for which the chamber is used, a second baseline process running an inert gas plasma, and a third baseline process running at sufficiently low power that no plasma ignites, (b) in respect of each said baseline process, determine the magnitudes of a plurality of Fourier components of delivered RE power and store the magnitudes as reference data for that baseline process, and (c) when a fault on the chamber is to be classified, repeat at least one of the said baseline process types according to a predetermined decision tree to classify the fault by comparing the current magnitudes of the said Fourier components with the corresponding reference data.

* * * * *